United States Patent
Stanton

(10) Patent No.: US 9,169,555 B2
(45) Date of Patent: Oct. 27, 2015

(54) CHEMICAL VAPOUR DEPOSITION APPARATUS

(75) Inventor: Gareth David Stanton, North Somerset (GB)

(73) Assignee: Edwards Limited, Crawley, West Sussex (GB)

(*) Notice: Subject to any disclaimer, the term of this patent is extended or adjusted under 35 U.S.C. 154(b) by 1832 days.

(21) Appl. No.: 11/601,524

(22) Filed: Nov. 17, 2006

(65) Prior Publication Data

US 2007/0128358 A1 Jun. 7, 2007

(30) Foreign Application Priority Data

Nov. 24, 2005 (GB) .................................. 0523948.8

(51) Int. Cl.
  *C23C 16/448* (2006.01)
  *C23C 16/44* (2006.01)

(52) U.S. Cl.
  CPC ......... *C23C 16/4481* (2013.01); *C23C 16/4412* (2013.01); *Y02C 20/30* (2013.01)

(58) Field of Classification Search
  CPC . C23C 16/4481; C23C 16/4412; Y02C 20/30
  See application file for complete search history.

(56) References Cited

U.S. PATENT DOCUMENTS

| | | | | |
|---|---|---|---|---|
| 4,717,596 A | * | 1/1988 | Barbee et al. | 427/248.1 |
| 5,460,654 A | * | 10/1995 | Kikkawa et al. | 118/726 |
| 5,851,293 A | * | 12/1998 | Lane et al. | 118/715 |
| 2004/0079286 A1 | * | 4/2004 | Lindfors | 118/715 |
| 2004/0094091 A1 | * | 5/2004 | Yang et al. | 118/715 |
| 2004/0206237 A1 | | 10/2004 | Sherer | |
| 2005/0061245 A1 | * | 3/2005 | Kim | 118/715 |
| 2005/0279453 A1 | * | 12/2005 | Elliott et al. | 156/345.29 |
| 2006/0156979 A1 | * | 7/2006 | Thakur et al. | 118/715 |
| 2007/0119486 A1 | * | 5/2007 | Park et al. | 134/95.2 |
| 2007/0128358 A1 | * | 6/2007 | Stanton | 427/248.1 |

OTHER PUBLICATIONS

United Kingdom Search Report of Application No. GB 0523948.8; Claims searched: 1-20; Date of search: Mar. 23, 2006.

\* cited by examiner

*Primary Examiner* — Jeffrie R Lund
(74) *Attorney, Agent, or Firm* — Westman, Champlin & Koehler, P.A.

(57) ABSTRACT

Chemical vapor deposition apparatus comprises a process chamber, a bubbler for supplying a volatile precursor to the chamber, a vacuum pump for drawing an exhaust gas from the process chamber, an abatement device for treating the exhaust gas, and a bypass line for conveying the precursor from the bubbler to the abatement device, the bypass line bypassing both the process chamber and the vacuum pump.

14 Claims, 2 Drawing Sheets

CHEMICAL VAPOUR DEPOSITION APPARATUS

FIELD OF THE INVENTION

The present invention relates to chemical vapour deposition apparatus. In one example, the invention relates to a chemical vapour deposition apparatus in which a volatile precursor is supplied to a process chamber for use in the deposition process.

BACKGROUND OF THE INVENTION

Some semiconductor processes use tetraethylorthosilicate (TEOS), OMTCS or other volatile liquid precursors that are liquid at room temperature and pressure. TEOS is commonly supplied from a bubbler to a process chamber for the deposition of thin films of silicon dioxide ($SiO_2$) on semiconductor substrates using a chemical vapour deposition (CVD) process. Within the process chamber, the TEOS dissociates in the presence of an oxygen source to form $SiO_2$, which deposits on the substrate within the chamber.

Depending on the flow rate of the gaseous TEOS to the chamber, a waste stream drawn from the chamber by a vacuum pumping arrangement typically contains unconsumed TEOS, as well as by-products from the process within the chamber. Therefore, an abatement device is typically provided downstream from the vacuum pumping arrangement for removing TEOS from the waste stream before it is exhausted into the atmosphere.

As is known, the bubbler comprises a container for receiving TEOS from a source thereof, and into which a carrier gas, such as helium or hydrogen, is introduced. The flowing gas causes continuous evaporation of some of the TEOS, so that a gas mixture of carrier gas and vaporised TEOS is exhaust from the container to the process chamber.

In the event that the container overfills with TEOS, or if the container requires emptying for any reason, it is usual practice to dump the contents of the container into the process chamber, or into the foreline extending between the processing is being conducted within the process chamber. The discharge of TEOS in this manner can lead to random accumulation of pools of volatile, flammable TEOS within the foreline or the pumping arrangement. This can present a safety hazard, as the TEOS may react strongly with other species subsequently introduced to the process chamber, for example fluorine for chamber cleaning, or with air leaking into the pumping arrangement. In addition, random accumulation of liquid within the pumping arrangement can lead to large fluctuations in the gas flow entering the abatement device, which can be detrimental to the efficiency of the gas abatement, and hydrodynamic lock in a vacuum pump.

It is an aim of at least the preferred embodiments of the present invention to seek to solve these and other problems.

SUMMARY OF THE INVENTION

The present invention provides chemical vapour deposition apparatus comprising a process chamber, a bubbler for supplying a volatile precursor to the chamber, a vacuum pump for drawing an exhaust gas from the process chamber, an abatement device for treating the exhaust gas, and a bypass line for conveying the precursor from the bubbler to the abatement device, the bypass line bypassing both the process chamber and the vacuum pump.

BRIEF DESCRIPTION OF THE DRAWINGS

Preferred features of the present invention will now be described with reference to the accompanying drawings, in which.

DETAILED DESCRIPTION OF THE INVENTION

Figure 1:
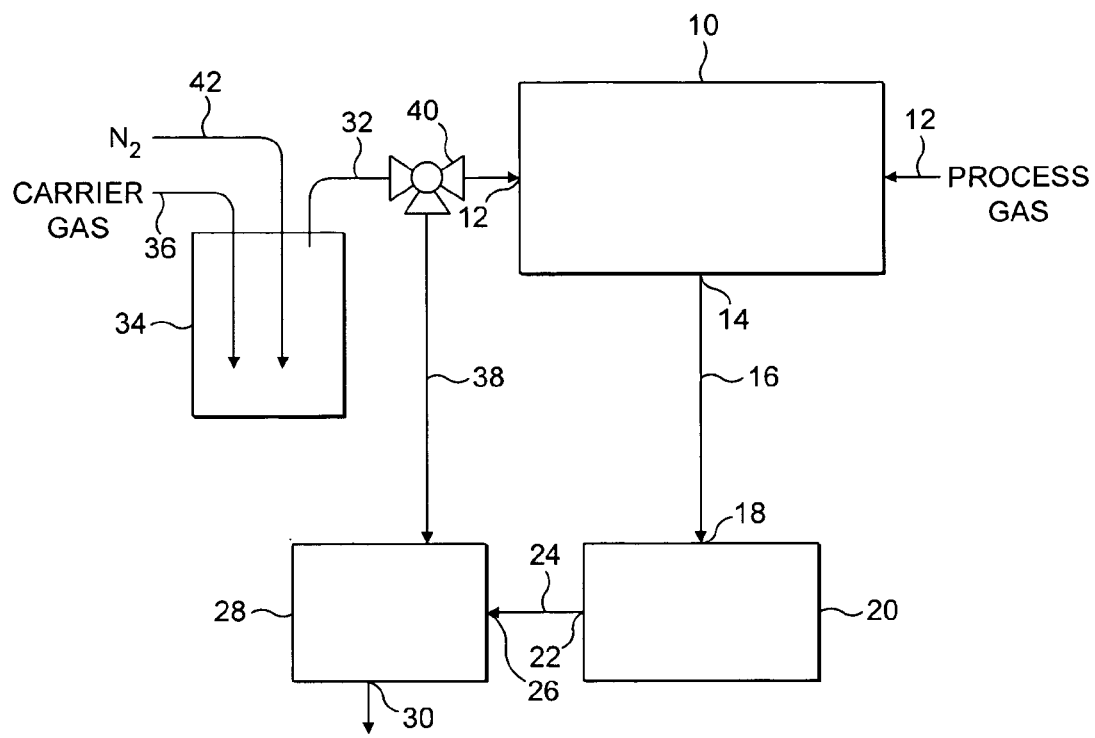
FIG. 1 illustrates schematically a first example of a chemical vapour deposition apparatus.

With reference to the first embodiment illustrated in FIG. 1, a chemical vapour deposition apparatus for use in the formation of devices such as semiconductors or flat panel display devices comprises a process chamber 10 having one or more inlets 12 for receiving process gases, and an outlet 14 for exhausting a gas stream comprising unconsumed process gases and by-products from the process conducted within the process chamber 10. The outlet 14 from the process chamber 10 is connected by foreline 16 to the inlet 18 of a vacuum pump 20 for drawing the gas stream from the process chamber 10. The vacuum pump 20 has an exhaust 22 connected by a conduit 24 to the inlet 26 of an abatement device 28, for example a combustion device, for treating the gas stream to remove one or more harmful components from the gas stream before it is exhaust into the atmosphere from outlet 30.

One of the inlets 12 of the process chamber 10 is connected by a conduit 32 to a bubbler 34 from which a volatile precursor, such as, but not restricted to, one of TEOS, OMCTS, TMCTS and DMDMOS, is supplied to the process chamber 10 for use in a deposition process. The bubbler 34 comprises a vessel containing liquid precursor, which is supplied to the vessel from a supply pipe (not shown). A sensor may be provided for monitoring the amount of liquid precursor within the vessel, with the supply of liquid precursor to the vessel being controlled in dependence on an output from the sensor.

A carrier gas, such as helium, hydrogen, nitrogen or argon, is supplied to the bubbler 34 using conduit 36. When carrier gas bubbles from the end of the conduit 36 and passes through the liquid precursor contained within the bubbler 34, this results in evaporation of some of the liquid precursor, and so a gas mixture of vaporised precursor and carrier gas flows from the bubbler 34 into the conduit 32.

When surplus precursor is to be discharged from the bubbler 34, for example when the bubbler 34 contains excess liquid precursor or when the bubbler 34 requires emptying for any reason, it is desirable that this surplus precursor is not discharged through the vacuum pump 20 as this may result in the accumulation of pools of volatile liquid precursor within the foreline 16 and/or within the vacuum pump 20. Therefore, in accordance with the invention a bypass line 38 is provided for conveying surplus precursor from the bubbler 34 to the abatement device 28, the bypass line 38 bypassing both the process chamber 10 and the vacuum pump 20.

In this first embodiment, the surplus precursor is conveyed through the bypass line 38 in a vaporised form. The bypass line 38 extends from the conduit 32 that conveys the gas mixture of vaporised precursor and carrier gas from the bubbler 34 to the chamber 10, and leads directly to the abatement device 28. A three-way valve 40 is located at the junction between the conduit 32 and the bypass line 38, the valve 40 being selectively moveable between a first position at which the bypass line 38 is open and the supply of precursor to the chamber 10 is inhibited, and a second position at which the bypass line 38 is open and the supply of precursor to the chamber 10 is enabled. Alternatively, an arrangement of two way valves in the conduit 32 and bypass line 38 may control the direction in which the precursor passes to the abatement device 28.

In this embodiment, the surplus precursor is urged into the bypass line 38 by the supply of a stream of pressurised and/or hot gas which is preferably inert to the precursor, such as nitrogen, argon, helium, methane or propane, through pipe 42 to the bubbler 34 so that a mixture of the vaporised precursor and the gas leaves the bubbler 34 and is directed into the bypass line 38 by the valve 40. A flow orifice or other suitable device may be located within the pipe 42 to control the rate at which the gas is supplied to the bubbler 34.

Figure 2:
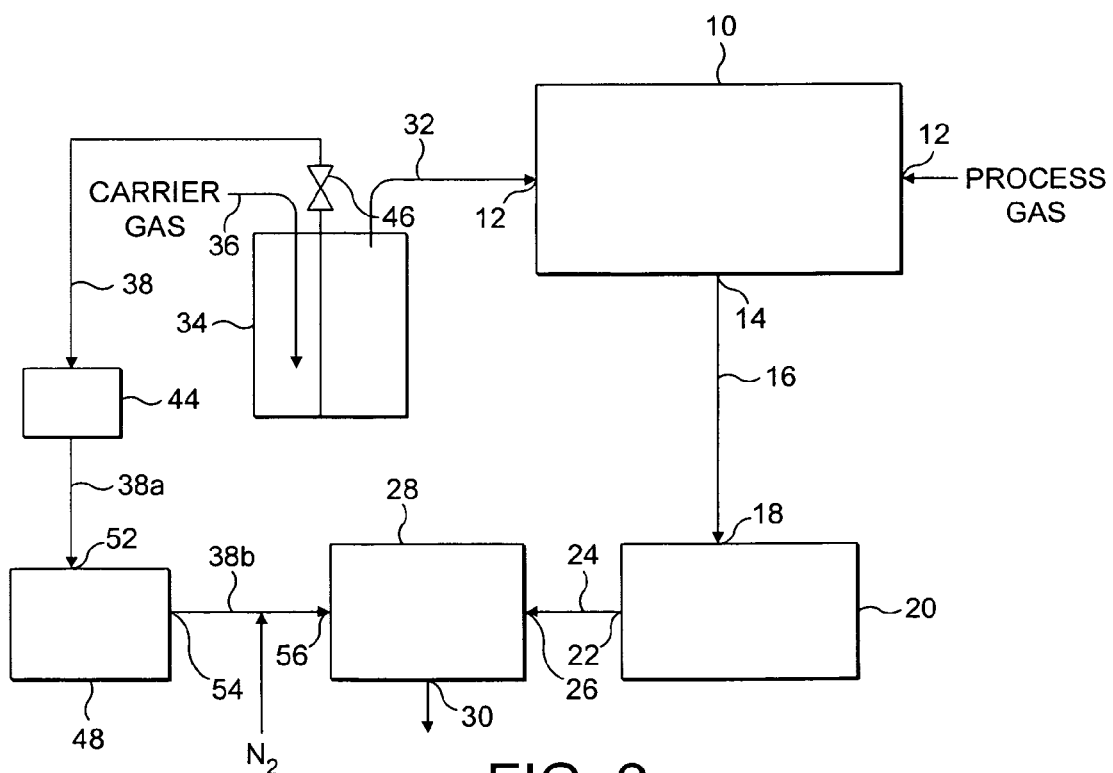
FIG. 2 illustrates schematically a second example of a chemical vapour deposition apparatus.

In the second embodiment illustrated in FIG. 2, the surplus precursor is conveyed into the bypass line in a liquid form. In this embodiment, the bypass line extends from the bubbler 34 to the abatement device 28. The bypass line comprises a first bypass line portion 38a and a second bypass line portion 38b. One end of the first bypass line portion 38a is located within the bubbler 34 at a level below that at which the liquid precursor is normally maintained in the bubbler 34. A pump 44, for example a peristaltic pump, is located within the first bypass line portion 38a for drawing liquid precursor from the bubbler as required. A valve 46 may be located between the bubbler 34 and the pump 44 to control the flow of liquid precursor through the first bypass line portion 38a.

Figure 3:
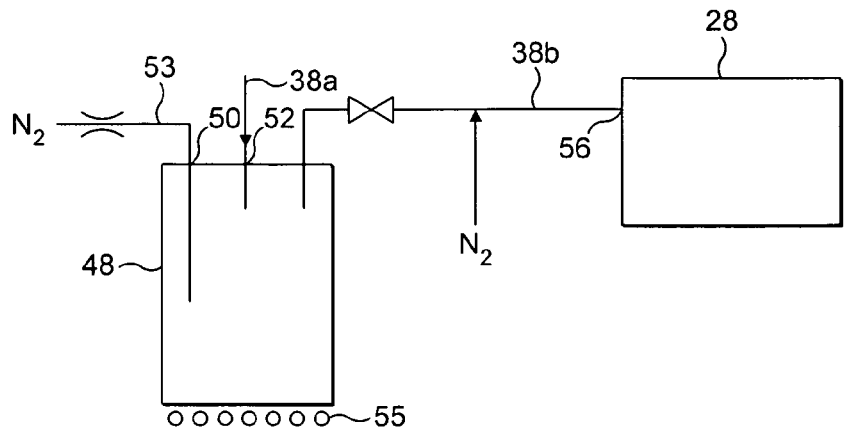
FIG. 3 illustrates in more detail the holding vessel of the apparatus of FIG. 2.

The other end of the first bypass line portion 38a enters a first inlet 52 of a holding vessel 48 located between the bubbler 34 and the abatement device 28 for controlling the rate at which the precursor is supplied to the abatement device 28. As illustrated in more detail in FIG. 3, the holding vessel 48 has a similar configuration to the bubbler 34. The holding vessel 48 has a second inlet 50 that receives a pipe 53 through which a stream of pressurised and/or hot gas which is preferably inert to the liquid precursor collected in the holding vessel 48, such as nitrogen, argon, helium, methane or propane, may be selectively or periodically supplied to the holding vessel 48 so that a mixture of the vaporised precursor and the gas can be output from the holding vessel 48 into the second bypass line portion 38b and conveyed thereby to inlet 56 of the abatement device 28. Nitrogen may be supplied to the second bypass line portion 38b to inhibit condensation of precursor within the second bypass line portion 38b. Apparatus such as a heater 55 or other heating mechanism may alternatively, or additionally, be provided for selectively vaporising the liquid precursor collected in the holding vessel 48. In this manner, the precursor can be supplied to the abatement device at a convenient time, for example when the abatement device is not receiving exhaust gas from the process chamber 10.

Alternatively, a valve may be provided to enable the liquid precursor to be periodically or selectively drained from the holding vessel as required.

As an alternative to using a pump 44 to urge the liquid precursor through the bypass line 38, the liquid precursor may be siphoned from the bubbler 34 as required. In the third embodiment illustrated in FIG. 4, a pump 60 has an inlet connected to the holding vessel 48 so that when valve 46 is closed, the holding vessel 48 can be evacuated. When surplus precursor is to be discharged from the bubbler 34, valve 46 may then simply be opened to cause surplus precursor to flow through the first bypass line portion 38a to the holding vessel 48. The surplus precursor may then be discharged from the holding vessel 48 to the abatement device 28 when convenient.

Figure 4:
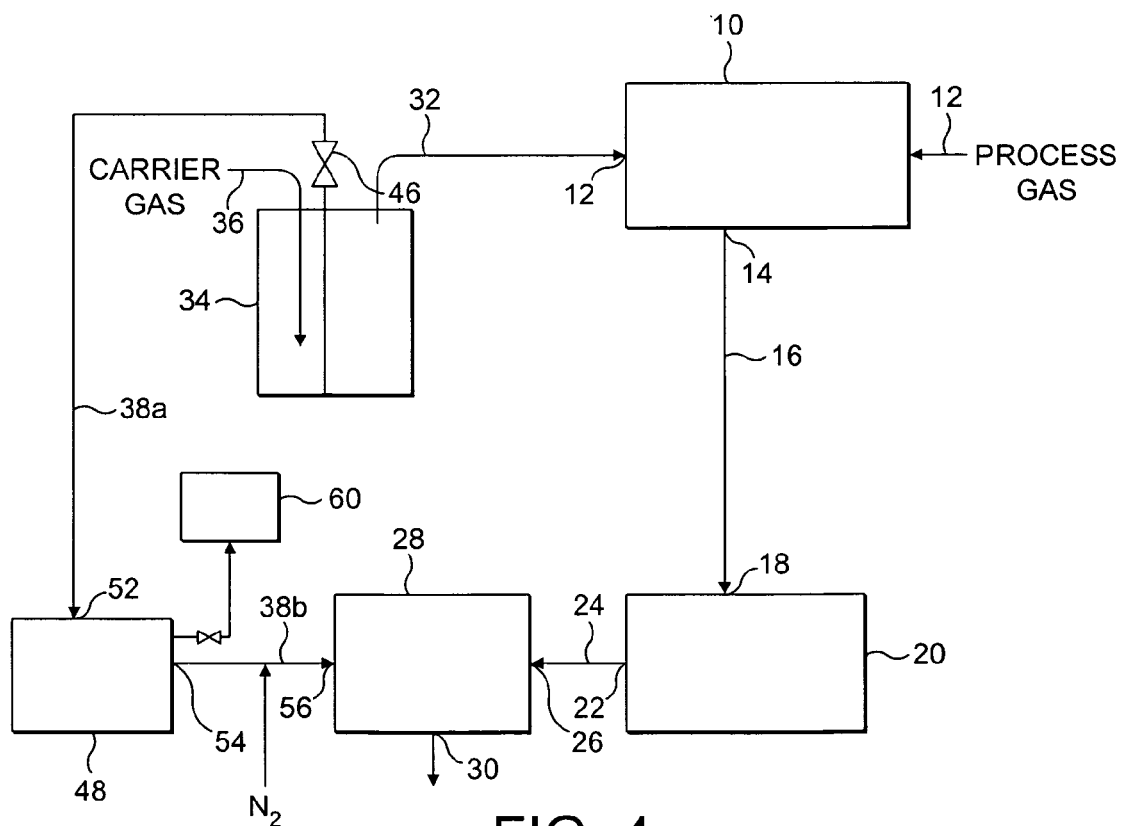
FIG. 4 illustrates schematically a third example of a chemical vapour deposition apparatus

The first embodiment may be combined with either of the second and third embodiments, so that when the bubbler 34 is to be emptied, the draining can be initially conducted by conveying the precursor from the bubbler 34 in liquid phase by pumping or siphoning liquid precursor from the bubbler 34 through first bypass line portion 38a illustrated in FIGS. 2 and 4, and then subsequently completing the drainage of precursor from the bubbler 34 by conveying the hot and/or pressurised gas stream to the bubbler 34 so that the remaining precursor is conveyed to the abatement device 28 in vapour phase through bypass line 38 illustrated in FIG. 1.

By providing a bypass line that bypasses both the process chamber and the vacuum pump, the accumulation of volatile precursor within the vacuum pump when surplus precursor is discharged from the bubbler, for example when the bubbler is emptied or when the bubbler contains excess precursor, can be inhibited. In addition, this surplus precursor can remain isolated from any oxidising species contained with gases exhaust from the process chamber during cleaning or other process within the chamber, reducing the risk of fire. Therefore, the present invention also provides a method of inhibiting the accumulation of a volatile precursor within a vacuum pump used to draw a gas stream from a process chamber of a chemical vapour deposition apparatus, the method comprising the steps of providing a bypass line for conveying the precursor from a bubbler for supplying the precursor to the chamber to an abatement apparatus for treating gas exhaust from the chamber, the bypass line bypassing both the process chamber and the vacuum pump, and conveying the precursor through the bypass line when surplus precursor is discharged from the bubbler.

In one embodiment, the bypass line extends from the bubbler itself, whereas in another embodiment the bypass line extends from a conduit that conveys the precursor from the bubbler to the chamber. In this latter embodiment, a device may be provided for directing the precursor to a selected one of the bypass line and the chamber. For example, a valve may be provided at the junction between the bypass line and the conduit, the valve being selectively moveable between a first position at which the bypass line is open and the supply of precursor to the chamber is inhibited, and a second position at which the bypass line is open and the supply of precursor to the chamber is enabled.

The bypass line may be provided with a system for controlling the rate at which the precursor is supplied to the abatement device. For instance, a holding vessel may be located in the bypass line for receiving the precursor from the bubbler and from which the precursor is supplied to the abatement device, with a control system being provided for controlling the rate at which the precursor is supplied from the holding vessel to the abatement device. The surplus precursor can be thus be conveyed to the abatement device at a time and/or rate that minimises any disruption to the treatment of the gases exhaust from the process chamber. The control system may comprise a heating mechanism for heating the precursor collected in the holding vessel to a temperature at which at least some of the collected precursor is vaporised, and a valve located in the bypass line between the holding vessel and the abatement device for controlling the rate at which the vaporised precursor is conveyed from the holding vessel to the abatement device. The heating mechanism can assist in achieving a substantially constant evaporation rate, or periodic evaporation, of precursor from the holding vessel. Alternatively, or additionally, a stream of pressurised and/or hot gas may be supplied to the holding vessel so that a mixture of the vaporised precursor and the gas is conveyed from the holding vessel to the abatement device. This gas is preferably inert to the collected liquid, and preferably comprises one of hydrogen, helium, nitrogen, argon, methane, propane and steam.

A system is preferably provided for urging the precursor from the bubbler into the bypass line. In one embodiment, the urging system is arranged to urge the precursor into the bypass line in a vapour form. For example, a stream of pressurised and/or hot gas may be supplied to the bubbler so that a mixture of the vaporised precursor and the gas enters the bypass line. This gas is preferably inert to the precursor, and preferably comprises one of hydrogen, helium, nitrogen, argon, methane, propane and steam. By removing the surplus precursor from the bubbler in this manner, the bubbler may be completely emptied. In order to enable the surplus precursor to be removed from the bubbler at a faster rate, in another embodiment the urging system is arranged to urge the precursor into the bypass line in a liquid form. For example a pump, such as a peristaltic pump, may be located in the bypass line for drawing liquid precursor from the bubbler. Alternatively, liquid precursor may be selectively siphoned from the bubbler into the bypass line by evacuating the holding vessel and then allowing the surplus precursor to flow from the bubbler to the holding vessel through the action of the pressure difference established between the bubbler and the holding vessel. As this may not result in complete emptying of the bubbler, if so desired, a stream of pressurised and/or hot gas may be subsequently supplied to the bubbler so that the remaining precursor can be removed from the bubbler within a gas mixture. As another alternative, the bubbler can be simply disconnected from the process chamber and docked directly to an inlet of the abatement device to enable the remaining precursor to be removed from the bubbler.

A liquid sensor or other suitable device may be provided for monitoring the amount of precursor within the bubbler, and the urging system may be actuated depending on an output from the sensor.

While the foregoing description and drawings represent the preferred embodiments of the present invention, it will be apparent to those skilled in the art that various changes and modifications may be made therein without departing from the true spirit and scope of the present invention.

The invention claimed is:

1. Chemical vapour deposition apparatus comprising:
a process chambers;
a bubbler for supplying a volatile precursor to the chamber;
a vacuum pump for drawing an exhaust gas from the process chambers;
an abatement device disposed downstream of the vacuum pump for treating the exhaust gas;
a bypass line for conveying the precursor from the bubbler to the abatement device, the bypass line bypassing both the process chamber and the vacuum pump that is disposed upstream of the abatement device,
a holding vessel fluidly connected between the bubbler and the abatement device via the bypass line for receiving the precursor from the bubbler, wherein the holding vessel is not in fluid connection with the process chamber;
a heater for vaporizing the precursor in the holding vessel; and
a control system for controlling a rate at which the precursor is supplied from the holding vessel to the abatement device.

2. The apparatus according to claim 1 wherein the bypass line extends from a conduit that conveys the precursor from the bubbler to the chamber.

3. The apparatus according to claim 2 comprising a device for directing the precursor to the bypass line or to the chamber.

4. The apparatus according to claim 3 wherein the device comprises a valve selectively moveable between a first position at which the bypass line is open and the supply of precursor to the chamber is inhibited, and a second position at which the bypass line is open and the supply of precursor to the chamber is enabled.

5. The apparatus according to claim 1 comprising a system for urging the precursor from the bubbler into the bypass line.

6. The apparatus according to claim 5 wherein the system is arranged to urge the precursor into the bypass line in a vaporized form.

7. The apparatus according to claim 6 wherein the system is arranged to supply stream of pressurised gas to the bubbler so that a mixture of the vaporized precursor and the gas enters the bypass line.

8. The apparatus according to claim 7 wherein the gas is inert to the precursor.

9. The apparatus according to claim 7 wherein the gas comprises one of hydrogen, helium, nitrogen, argon, methane, propane and steam.

10. The apparatus according to claim 6 wherein the system is arranged to supply of a stream of hot gas to the bubbler so that a mixture of the vaporized precursor and the gas enters the bypass line.

11. The apparatus according to claim 10 wherein the gas is inert to the precursor.

12. The apparatus according to claim 10 wherein the gas comprises at least one compound selected from the group consisting of hydrogen gas, helium gas, nitrogen gas, argon gas, methane, propane and steam.

13. The apparatus according to claim 5 wherein the system is arranged to urge the precursor into the bypass line in a liquid form.

14. The apparatus according to claim 13 wherein the system comprises a pump.

* * * * *